(12) United States Patent
Sheahan et al.

(10) Patent No.: US 11,887,937 B2
(45) Date of Patent: Jan. 30, 2024

(54) REDUCTION IN SUSCEPTIBILITY OF ANALOG INTEGRATED CIRCUITS AND SENSORS TO RADIO FREQUENCY INTERFERENCE

(71) Applicant: ams International AG, Jona (CH)

(72) Inventors: Benjamin Joseph Sheahan, Eindhoven (NL); Richard Jennings, Eindhoven (NL); Robert Allen Helmick, Eindhoven (NL); Marko Magerl, Eindhoven (NL); Christian Stockreiter, Eindhoven (NL)

(73) Assignee: ams International AG, Jona (CH)

( * ) Notice: Subject to any disclaimer, the term of this patent is extended or adjusted under 35 U.S.C. 154(b) by 199 days.

(21) Appl. No.: 17/428,914

(22) PCT Filed: Feb. 3, 2020

(86) PCT No.: PCT/EP2020/052635
§ 371 (c)(1),
(2) Date: Aug. 5, 2021

(87) PCT Pub. No.: WO2020/161080
PCT Pub. Date: Aug. 13, 2020

(65) Prior Publication Data
US 2022/0254729 A1   Aug. 11, 2022

Related U.S. Application Data

(60) Provisional application No. 62/803,049, filed on Feb. 8, 2019.

(51) Int. Cl.
*H01L 23/552* (2006.01)
*H01L 23/538* (2006.01)
(Continued)

(52) U.S. Cl.
CPC ........ *H01L 23/552* (2013.01); *H01L 23/5389* (2013.01); *H01L 23/66* (2013.01);
(Continued)

(58) Field of Classification Search
CPC ... H01L 23/552; H01L 23/5389; H01L 23/66; H01L 24/06; H01L 24/49
See application file for complete search history.

(56) References Cited

U.S. PATENT DOCUMENTS

| 4,796,084 A | 1/1989 | Kamasaki |
| 6,208,447 B1 | 3/2001 | Oosawa |

(Continued)

FOREIGN PATENT DOCUMENTS

JP   S57128082 A   8/1982

OTHER PUBLICATIONS

International Search Report dated Apr. 8, 2020 for corresponding International Application No. PCT/EP2020/052635.

*Primary Examiner* — Marc Anthony Armand
(74) *Attorney, Agent, or Firm* — TAROLLI, SUNDHEIM, COVELL & TUMMINO L.L.P.

(57) ABSTRACT

An apparatus comprises a ground plane (2), an integrated circuit chip (1) disposed on the ground plane (2), the integrated circuit chip (1) comprising one or more electrically conductive layers (10) encircling a periphery of the integrated circuit chip (1), and a plurality of bondwires (9) electrically coupling the one or more electrically conductive layers (10) to the ground plane (2).

19 Claims, 3 Drawing Sheets

(51) Int. Cl.
*H01L 23/66* (2006.01)
*H01L 23/00* (2006.01)

(52) U.S. Cl.
CPC .............. *H01L 24/06* (2013.01); *H01L 24/49* (2013.01); *H01L 2224/48091* (2013.01); *H01L 2924/14* (2013.01); *H01L 2924/3025* (2013.01)

(56) References Cited

U.S. PATENT DOCUMENTS

| | | |
|---|---|---|
| 2006/0244133 A1 | 11/2006 | Chen |
| 2007/0278632 A1 | 12/2007 | Zhao |
| 2010/0109052 A1* | 5/2010 | Nakajima ....... H01L 21/823475 257/E27.06 |
| 2010/0314727 A1* | 12/2010 | Uchida .................. H01L 24/05 257/659 |
| 2011/0079892 A1 | 4/2011 | Tsai |
| 2014/0117473 A1* | 5/2014 | Kierse .................. B81B 7/0061 438/51 |
| 2014/0191376 A1* | 7/2014 | Huang ................ H01L 25/0657 257/659 |
| 2016/0099192 A1 | 4/2016 | Chen |
| 2019/0326234 A1* | 10/2019 | Benson ............... H01L 23/3677 |
| 2020/0321286 A1* | 10/2020 | Hooper ............... H01L 23/3185 |

\* cited by examiner

REDUCTION IN SUSCEPTIBILITY OF ANALOG INTEGRATED CIRCUITS AND SENSORS TO RADIO FREQUENCY INTERFERENCE

RELATED APPLICATIONS

The present invention is a U.S. National Stage under 35 USC 371 patent application, claiming priority to Serial No. PCT/EP2020/052635, filed on 3 Feb. 2020; which claims priority from U.S. Provisional Application No. 62/803,049 filed 8 Feb. 2019, the entirety of both of which are incorporated herein by reference.

TECHNICAL FIELD

The present invention relates to reducing the susceptibility of integrated circuits and sensors, for example analog circuits and sensors, to radio frequency interference.

BACKGROUND

Analog integrated circuits can be subjected to intense magnetic and electric fields when an adjacent RF antenna communicates with a base station. Analog circuits are also subjected to intense fields while being evaluated for Electro-Magnetic Compatibility (EMC), for example in a Transverse Electro-Magnetic (TEM) Cell with the transmission line parallel to the surface of the integrated circuit. TEM Cell tests can generate both a magnetic field (H) into the side of die, and a vertical electric field (E) into the top of the die. A TEM Cell test is described in IEC 62132-8, which specifies a method for measuring the immunity of an integrated circuit (IC) to radio frequency (RF) electromagnetic interference across a frequency range of 150 KHz to 3 GHz.

Such exposure to intense magnetic and electric fields can cause analog integrated circuits and communication circuits to exhibit severe errors, such that the output is incorrect or the communication fails entirely.

It is a known shielding technique to provide a metal box surrounding the integrated circuit. However, for an optical circuit (e.g., a circuit that includes a color sensor, an optical proximity sensor, or other optical sensor) such a technique may not be possible, for example because it is necessary for external light to be sensed by the integrated circuit.

SUMMARY

According to a first aspect of the present invention there is provided an apparatus comprising a ground plane and an integrated circuit chip disposed on the ground plane. The integrated circuit chip comprises one or more electrically conductive layers encircling a periphery of the integrated circuit chip, and a plurality of bondwires electrically coupling the one or more electrically conductive layers to the ground plane.

Embodiments described here, in the context of a light sensor, aim to block RF interference from entering into the integrated circuit or package, or at least significantly reduce that RF interference, without blocking the light that is to be sensed by the integrated circuit. The techniques can be used to reduce analog circuit malfunction and communication errors, in particular light-to-digital conversion errors, due to RF interference.

In an embodiment, the integrated circuit chip may comprise one or more optical sensors.

In an embodiment, the integrated circuit chip may have a bottom face attached to the ground plane and a top face on which said one or more electrically conductive layers define four corners, wherein each corner is electrically coupled to the ground plane by one or more of the plurality of bondwires. For each corner, a first wire of the plurality of bondwires may electrically couple the corner to the ground plane, and a second bondwire of the plurality of wires may electrically couple the corner to the ground plane. The first bondwire may be in a first plane, the second bondwire may be in a second plane, and the first plane may be orthogonal to the second plane. The first and second planes may be parallel to respective planes of side surfaces of the chip which meet at the corresponding corner. The plurality of bondwires may follow curved paths in their respective planes.

The apparatus may comprise a plurality of operational bondwires in addition to said first mentioned plurality of bondwires, and the first mentioned plurality of bondwires may extend further from the integrated circuit chip than said operational bondwires.

The one or more electrically conductive layers may comprise a plurality of metal layers in a stack. The one or more electrically conductive layers may comprise a scribe seal of the integrated circuit chip. The ground plane may be electrically conductive, and may comprise copper.

The integrated circuit chip may comprise a substrate layer and an epitaxial layer. The substrate layer may be positioned between the epitaxial layer and the ground plane.

In an embodiment, the substrate layer and the epitaxial layer may be positioned between the one or more electrically conductive layers and the ground plane.

The apparatus may comprise a wireless transmitter in proximity to the integrated circuit chip, wherein the wireless transmitter induces a magnetic field during operation, and wherein a magnitude of the magnetic field impinging on the integrated circuit chip may be reduced, at least in part, by the one or more electrically conductive layers and the plurality of bondwires.

The apparatus may comprise a metal layer on a top face of the integrated circuit chip, which may be coupled to said ground plane by a bondwire, and may have an opening to expose an optical sensor of the integrated circuit chip.

According to a second aspect of the present invention there is provided an apparatus comprising an integrated circuit chip comprising one or more optical sensors and one or more electrically conductive layers encircling a periphery of the integrated circuit chip, and means for reducing radio frequency interference to one or more components of the integrated circuit chip.

In an embodiment, the one or more electrically conductive layers may comprise a scribe seal of the integrated circuit chip.

DETAILED DESCRIPTION

A changing magnetic field (e.g. $H_x$, $H_y$) that intersects one or more conductive loops with a vector component perpendicular to the loop (i.e., entering a side of the IC chip) excites a voltage in the loop which in turn generates a current, and thereby generates a magnetic field.

From Faraday's Law, the induced electromotive force (EMF) in the loop, created by the perpendicular component of the H field is:

$$-\frac{d\Phi}{dt} = -d(AB\cos(\omega t))/dt = \omega AB\sin(\omega T) = A*\mu_r*\mu_o*H*\omega*\sin(\omega t),$$

where $\Phi$ is magnetic flux, A is the area of the loop intersected by the field, B is magnetic flux density, $\omega$ is the frequency in radians per second of the magnetic field, $\mu_r$ is relative permeability, $\mu_o$ is the permeability of free space and H is magnetic field strength.

From Lenz's Law, the induced EMF always gives rise to a current whose magnetic field opposes the original change in magnetic flux, thus counteracting and mitigating the field entering the loop.

The EMF induced in a loop is proportional to the area of the loop, the frequency, and the H field strength. Accordingly, a 3 GHz, 20 A/m H field will develop 1000 times more EMF than a 3 MHz, 20 A/m H field. The EMF increase with frequency indicates the importance of keeping the loop impedance low in order to form an opposing magnetic field at high frequencies.

The provision of additional bondwires on a chip can take advantage of these principles to help reduce the RF interference that would otherwise occur.

Figure 1:
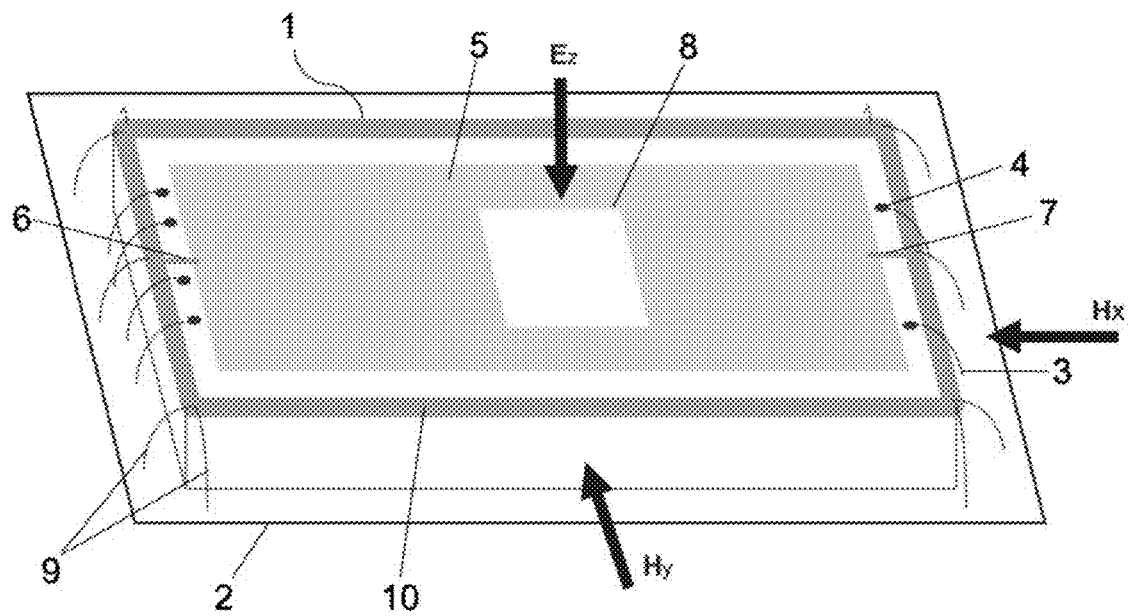
FIG. 1 shows an integrated circuit chip mounted on a metal ground plane, with a metal shield comprising an opening and eight additional corner bondwires.

Embodiments will now be described considering, for example, an apparatus such as an integrated circuit chip or "chip". Such a chip 1 is illustrated in FIG. 1, along with a ground plane 2 on which the chip is located. The ground plane may be a metal (e.g. copper) base, upon which the chip is mounted. Standard bondwires 3 are provided at the sides of the chip. These standard bondwires may be operational bondwires connected to, for example: inputs, outputs, power sources or control pins/pads 4 of the chip. A metal shield 5 is also provided, connected to the VSSA and VSSD pins 6, 7 of the chip. The shield is provided with an opening 8, to allow light to be sensed by an optical sensor of the chip (not shown). The chip is assumed to be subjected to changing horizontal magnetic fields, $H_x$ and $H_y$, and a changing vertical electric field, $E_z$, such as might result from the operation of an adjacent RF transmitter, e.g. an antennae.

Additional bondwires 9 are provided, which are coupled electrically together, and are connected to the ground plane 2. Specifically, the additional bondwires 9 are electrically coupled by one or more electrically conductive (e.g. metal) layers 10, provided along or adjacent to the edge of the chip. The electrically conductive layer(s) may comprise a plurality of metal layers in a stack such that together they completely encircle the interior of the chip. Together, the layers 10, ground plane 2, and additional bondwires 9 form low impedance electrical loops. It is these loops in which an EMF is induced by the changing magnetic field, to produce an opposing magnetic field.

The additional bondwires 9 are provided at one or more of the corners of the chip. In the example shown in FIG. 1, there are a total of eight additional bondwires, with two bondwires at each corner of the chip. This arrangement provides optimal H field mitigation on all four sides of the chip.

Figure 2:
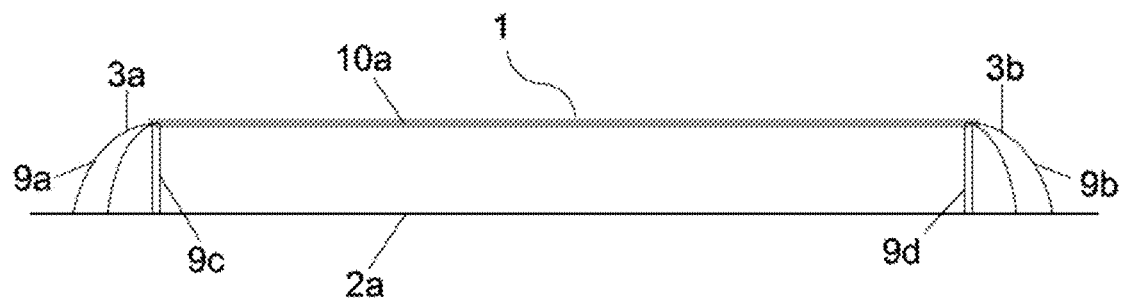
FIG. 2a shows a front view of the integrated circuit chip of FIG. 1.
FIG. 2b shows a front view of an alternative embodiment of the integrated circuit chip of FIG. 1.
Figure 3:
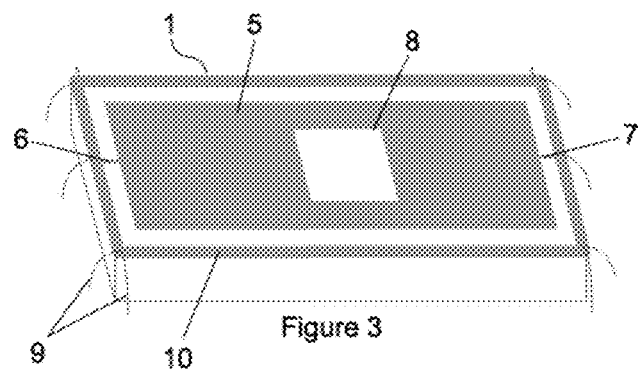
FIG. 3 shows an optical test chip with a metal shield comprising an opening and eight additional corner bondwires.
Figure 4:
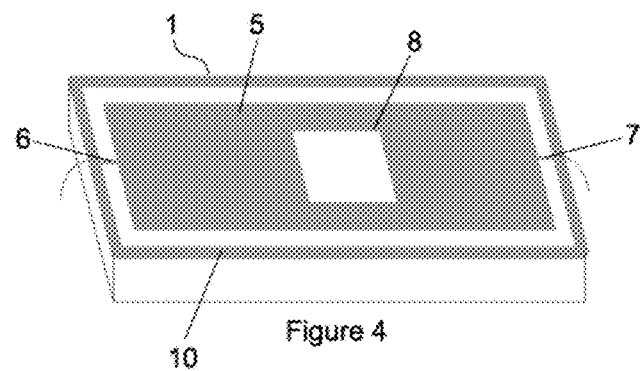
FIG. 4 shows an optical test chip with a metal shield comprising an opening and no additional bondwires.
Figure 5:
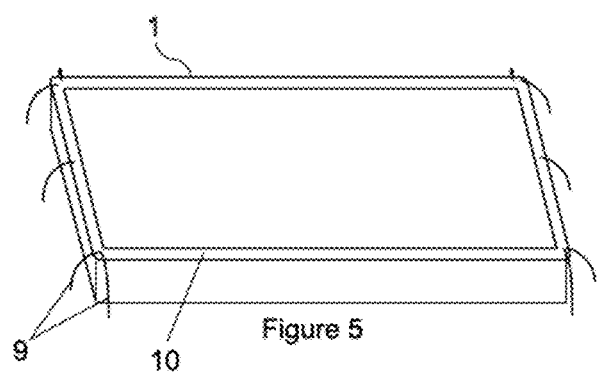
FIG. 5 shows an optical test chip with no shield and eight additional corner bondwires.
Figure 6:
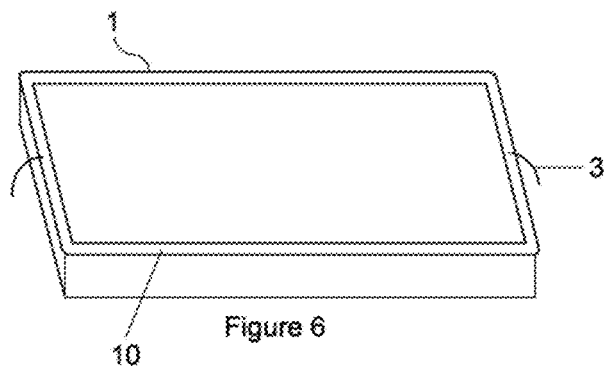
FIG. 6 shows an optical test chip with no metal shield and no additional bondwires.

In the front view of FIG. 2a, one of the low impedance electrical loops can be seen and is formed from a first one of the additional bondwires 9a, the electrically conductive layer 10a, a second one of the bondwires 9b, and the metal base/ground plane 2a. Also shown in FIG. 2a, each additional bondwire 9 preferably extends outward beyond the standard bondwires of the same chip face. This maximises the RF interference protection not only for the chip itself but also for the standard bondwires.

Alternatively, as illustrated in FIG. 2b, the integrated circuit chip 1 may comprise a substrate layer 2b and an epitaxial layer 2c. The substrate layer 2b may be positioned between the epitaxial layer 2c and the ground plane 2a. Thus, the substrate layer 2b and the epitaxial layer 2c may be positioned between the one or more electrically conductive layers 10a and the ground plane 2a.

By way of example, the electrically conductive layers which electrically connect the additional bondwires 9 may be layers of scribe seals. Scribe seals are often incorporated into a chip to prevent the propagation of cracks during the separation of individual dies from a wafer. The upper layer of the scribe seal can provide the dedicated interconnects and electrical coupling for the additional bondwires. Typically, the metal scribe seal surrounding the chip is not exposed, and is for example, surrounded by a layer of residual silicon. Access to this metal layer can be obtained, however, through cut-outs in the passivation layer over the chip. By using the scribe seal to provide the dedicated interconnects, the amount of chip modification required, production time and costs are reduced.

A TEM Cell test (such as that described in IEC 62132-8) may be used to subject the test chip to horizontal H and a vertical E fields. As described, additional bondwires can mitigate the H field in the horizontal plane. A top-side metal shield, formed by using the top layer metal of the IC to cover the device, then connecting this shield to ground, can be used to prevent the vertical E field from entering the IC. In combination, the additional bondwires and metal layer can form an effective shield for TEM Cell measurements for EMC testing of non-optical ICs. For optical ICs, a cut-out in the top metal shield may be required, for example to allow light to reach photodiodes. The larger the size of the cut-out, the lower the effectiveness of the shielding against the vertical E field.

Performance data has been collected upon test chips, using the TEM Cell. Test chips were manufactured in four different configurations, shown by the FIGS. 3 to 6. Two test chips were fabricated, one without a shield and the other with a top metal shield connected to the VSSA and VSSD pins at the opposite ends of the chip. These pins were shorted to ground. There were two bonding schemes, one with no corner bondwires and the other with eight corner bondwires to ground.

Figure 7:
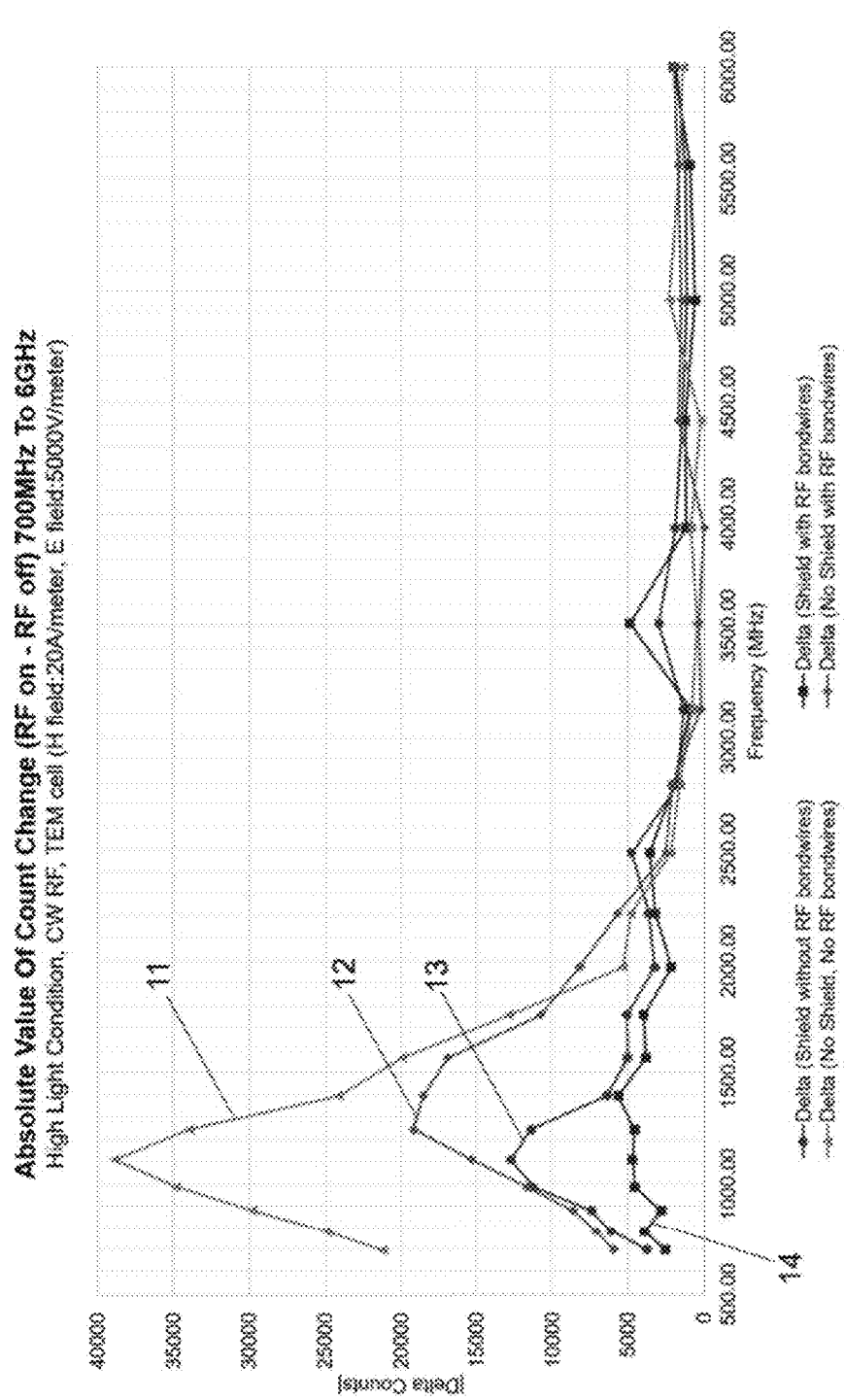
FIG. 7 shows the delta count (absolute difference between RF on and RF off) during TEM testing of the test chips illustrated in FIGS. 3 to 6.

The TEM cell test results are shown in FIG. 7. Delta count, which is the absolute difference in count between states where the RF is on and when the RF is off (counts of least significant bits (LSB) out of an Analog-to-Digital Converter (ADC)), is plotted as a function of frequency. In comparison to the unprotected chip (trace 11), the delta count is reduced by the presence of the additional bondwires alone (trace 12), and the shield alone (trace 13). The delta count is especially reduced for the test chip with both the shield and additional bondwires (trace 14). The raw count at the High Light level used for the testing is approximately 6,000,000. Therefore, the absolute (RF on-RF off) count difference for the shield plus eight corner bondwires test case is approximately 0.1% or less of the raw count.

The foregoing techniques can be used in a wide range of applications including, for example, the mobile device analog circuit market for sensors. The host device (e.g., smart phone) may include a module or package that can contain an integrated circuit (IC) chip (e.g., die) that includes an optical sensor (e.g., color sensor, optical proximity sensor or other optical sensor) and associated electronics operable to process signals from the sensor and to control other components of the host device (e.g., a display screen) in response to the signals from the sensor. The sensor can include, for example, one or more photodiodes. A controller (e.g., microprocessor on the chip or in the host device) can use the signals from the optical sensor to, for example, adjust the brightness of a display screen of the host device or to adjust a color temperature of the display screen based on the ambient light.

A highly effective shield is provided against fluctuating fields, in particular near-field horizontal magnetic field planes, that originate from adjacent antennas. This can help to reduce communication errors due to RF interference. In some instances, the techniques described here can reduce the impact of the RF interference within the analog integrated circuit or package by a significant amount (e.g., a factor of 10). Thus, the disclosed subject matter can help improve the RF immunity within the integrated circuit and/or package.

The techniques can be particularly advantageous, for example, for analog circuits and optical sensors operating in close proximity to a RF antenna or WiFi antenna. For example, the technique may be effective even when an antenna is at a distance of 1 mm or less from an IC circuit mounted on a flex cable or printed circuit board. These techniques also have the advantage of not requiring an expensive metal enclosure around the IC.

It will be appreciate by the person of skill in the art that various modifications may be made to the above described embodiments without departing from the scope of the present invention.

The invention claimed is:

1. An apparatus comprising:
a ground plane;
an integrated circuit chip disposed on the ground plane, the integrated circuit chip comprising one or more electrically conductive layers encircling a periphery of the integrated circuit chip; and
a plurality of bondwires electrically coupling the one or more electrically conductive layers to the ground plane.

2. The apparatus of claim 1, wherein said integrated circuit chip comprises one or more optical sensors.

3. The apparatus of claim 1, wherein the integrated circuit chip has a bottom face attached to the ground plane and a top face on which said one or more electrically conductive layers define four corners, and wherein each corner is electrically coupled to the ground plane by one or more of the plurality of bondwires.

4. The apparatus of claim 3, wherein, for each corner, a first wire of the plurality of bondwires electrically couples the corner to the ground plane, and a second bondwire of the plurality of wires electrically couples the corner to the ground plane.

5. The apparatus of claim 4, wherein the first bondwire is in a first plane, the second bondwire is in a second plane, and the first plane is substantially orthogonal to the second plane.

6. The apparatus of claim 5, wherein the said first and second planes are substantially parallel to respective planes of side surfaces of the chip which meet at the corresponding corner.

7. The apparatus of claim 6, wherein the plurality of bondwires follow curved paths in their respective planes.

8. The apparatus of claim 1 and comprising a plurality of operational bondwires in addition to said first mentioned plurality of bondwires, wherein said first mentioned plurality of bondwires extend further from the integrated circuit chip than said operational bondwires.

9. The apparatus of claim 1, wherein the one or more electrically conductive layers comprise a plurality of metal layers in a stack.

10. The apparatus of claim 1, wherein the one or more electrically conductive layers comprise a scribe seal of the integrated circuit chip.

11. The apparatus of claim 1, wherein the ground plane is electrically conductive.

12. The apparatus of claim 11, wherein the ground plane comprises copper.

13. The apparatus of claim 1, wherein the integrated circuit chip comprises a substrate layer and an epitaxial layer.

14. The apparatus of claim 13, wherein the substrate layer is positioned between the epitaxial layer and the ground plane.

15. The apparatus of claim 14, wherein the substrate layer and the epitaxial layer are positioned between the one or more electrically conductive layers and the ground plane.

16. The apparatus of claim 1 and comprising a wireless transmitter, e.g., an antenna, in proximity to the integrated circuit chip, wherein the wireless transmitter induces a magnetic field during operation, and wherein a magnitude of the magnetic field impinging on the integrated circuit chip is reduced, at least in part, by the one or more electrically conductive layers and the plurality of bondwires.

17. The apparatus of claim 1 and comprising a metal layer on a top face of the integrated circuit chip, optionally coupled to said ground plane by a bondwire, and/or optionally having an opening to expose an optical sensor of the integrated circuit chip.

18. An apparatus comprising: an integrated circuit chip comprising one or more optical sensors and one or more electrically conductive layers encircling a periphery of the integrated circuit chip, a ground plane, a means for reducing radio frequency interference to one or more components of the integrated circuit chip, and a plurality of bondwires electrically coupling the one or more electrically conductive layers to the ground plane.

19. The apparatus of claim 18, wherein the one or more electrically conductive layers comprise a scribe seal of the integrated circuit chip.

\* \* \* \* \*